United States Patent
Jones et al.

(10) Patent No.: US 10,115,697 B2
(45) Date of Patent: Oct. 30, 2018

(54) COUPLING ELEMENT, INTEGRATED CIRCUIT DEVICE AND METHOD OF FABRICATION THEREFOR

(71) Applicant: NXP USA, Inc., Austin, TX (US)

(72) Inventors: Jeffrey Kevin Jones, Chandler, AZ (US); Igor Blednov, Toulouse (FR)

(73) Assignee: NXP USA, INC., Austin, TX (US)

( * ) Notice: Subject to any disclaimer, the term of this patent is extended or adjusted under 35 U.S.C. 154(b) by 1 day.

(21) Appl. No.: 15/365,107

(22) Filed: Nov. 30, 2016

(65) Prior Publication Data

US 2017/0179063 A1 Jun. 22, 2017

(30) Foreign Application Priority Data

Dec. 22, 2015 (WO) .................. PCT/IB2015/002563

(51) Int. Cl.
*H01L 23/66* (2006.01)
*H01L 23/00* (2006.01)

(52) U.S. Cl.
CPC ............. *H01L 24/33* (2013.01); *H01L 23/66* (2013.01); *H01L 24/09* (2013.01); *H01L 24/27* (2013.01); *H01L 2224/331* (2013.01); *H01L 2924/30111* (2013.01)

(58) Field of Classification Search
CPC ......... H01L 23/66; H01L 24/09; H01L 24/27; H01L 24/33
USPC ....................................................... 257/691
See application file for complete search history.

(56) References Cited

U.S. PATENT DOCUMENTS

| | | | |
|---|---|---|---|
| 3,628,105 A | * | 12/1971 | Sakai ................ H01L 23/49534 174/551 |
| 3,815,054 A | | 6/1974 | McClure et al. |
| 5,752,182 A | | 5/1998 | Nakatsuka et al. |
| 6,211,462 B1 | | 4/2001 | Carter, Jr. et al. |
| 6,859,115 B1 | | 2/2005 | Hirsch et al. |
| 7,187,256 B2 | | 3/2007 | Oran |
| 8,030,763 B2 | | 10/2011 | Romero et al. |
| 8,487,703 B2 | | 7/2013 | Beldnov |
| 9,401,682 B2 | | 7/2016 | Blednov et al. |
| 2007/0235855 A1 | | 10/2007 | Bokatius et al. |

(Continued)

OTHER PUBLICATIONS

Harris, A.I. et al.: "Note: Cryogenic Microstripline-on-Kapton Microwave Interconnects", Jun. 8, 2012, pp. 1-3.

(Continued)

*Primary Examiner* — Moazzam Hossain
*Assistant Examiner* — Warren H Kilpatrick

(57) ABSTRACT

A coupling element for providing external coupling to a semiconductor die within an integrated circuit package. The coupling element comprises a flexible laminate structure comprising a flexible, electrically insulating substrate layer, a first conductive layer bonded to a first surface of the substrate layer, and a second conductive layer bonded to a second surface of the substrate layer. The coupling element is arranged to be coupled to the semiconductor die such that the first and second conductive layers are electrically coupled to electrical contacts of the semiconductor die. The coupling element is further arranged to extend through the integrated circuit package when electrically coupled to the semiconductor die, and for the first and second conductive layers to be further electrically coupled to at least one external component.

20 Claims, 5 Drawing Sheets

(56) References Cited

U.S. PATENT DOCUMENTS

2011/0001576 A1   1/2011   Lee et al.
2014/0132353 A1   5/2014   Cuoco et al.

OTHER PUBLICATIONS

Boulder Engineering Studio: "Evaluating High Speed Signal Integrity in Flexible Printed Circuits", web page: http:/boulderes.com/FPC, Jul. 27, 2015, pp. 1-8.
Liou, Chang-Ho et al.: "Low Loss Transmission Lines on Flexible COP Substrate by Standard Lamination Process", 2014 Electronic Components & Technology Conference, IEEE, pp. 1944-1948.
3M Innovation: "3M Flexible Circuits" Technical Brief: Signal Integrity/Electrical Performance, USA, 3M 2003, 80-6201-3001-5, pp. 1-2.
Olivier, Glenn: "Using Flex in High-Speed Applications", Dupont Electronics and Communications, The PCB Magazine, Mar. 2014, pp. 90-96.

\* cited by examiner

COUPLING ELEMENT, INTEGRATED CIRCUIT DEVICE AND METHOD OF FABRICATION THEREFOR

FIELD OF THE INVENTION

This invention relates to a coupling element for providing external coupling to a semiconductor die within an integrated circuit package, an integrated circuit device comprising such a coupling element and a method of fabrication of said coupling element.

BACKGROUND OF THE INVENTION

Modern state of the art radio frequency (RF) power integrated circuit (IC) devices such as, for example, LDMOS (laterally diffused metal oxide semiconductor) IC devices are required to achieve increasingly accurate and consistent performance, whilst at the same time there being a drive to reduce costs.

In order to achieve the increased performance, there is a continual need for improvement within RF power devices in relation to issues such as inconsistent RF grounding, parasitic inductance of die-to-lead interconnects, input drive and output match non-uniformity, power supply lead inductance (which can generate non-linearity or electrical 'memory effects'), and poor isolation between devices allocated next to each other within a single IC package. Also, growing demand for higher power efficiency and instant operational bandwidth of the RF devices requires a good control of impedances at the fundamental signal frequency $f_0$ and higher harmonics ($2f_0$, $3f_0$, $nf_0$) of the fundamental signal.

SUMMARY OF THE INVENTION

The present invention provides a coupling element for providing external coupling to a semiconductor die within an integrated circuit package, an integrated circuit device comprising such a coupling element and a method of fabrication of said coupling element as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

According to some example embodiments of the present invention, there is provided a coupling element for providing external coupling to a semiconductor die within an integrated circuit package. The coupling element consists of a flexible laminate structure including a flexible, electrically insulating substrate layer, a first conductive layer bonded to a first surface of the substrate layer, and a second conductive layer bonded to a second surface of the substrate layer.

The use of conductive layers bonded to a substrate layer to create a coupling element consisting of a flexible laminate structure in this manner enables 'broadside coupled' interconnects (formed by the conductive layers) to be created that provide the electrical paths between the semiconductor die and external components. Advantageously, the problem of mutual coupling that arises in the conventional use of arrays of bonding wires is significantly reduced, enabling a significantly more uniform input/output signal distribution to be achieved.

Figure 1:
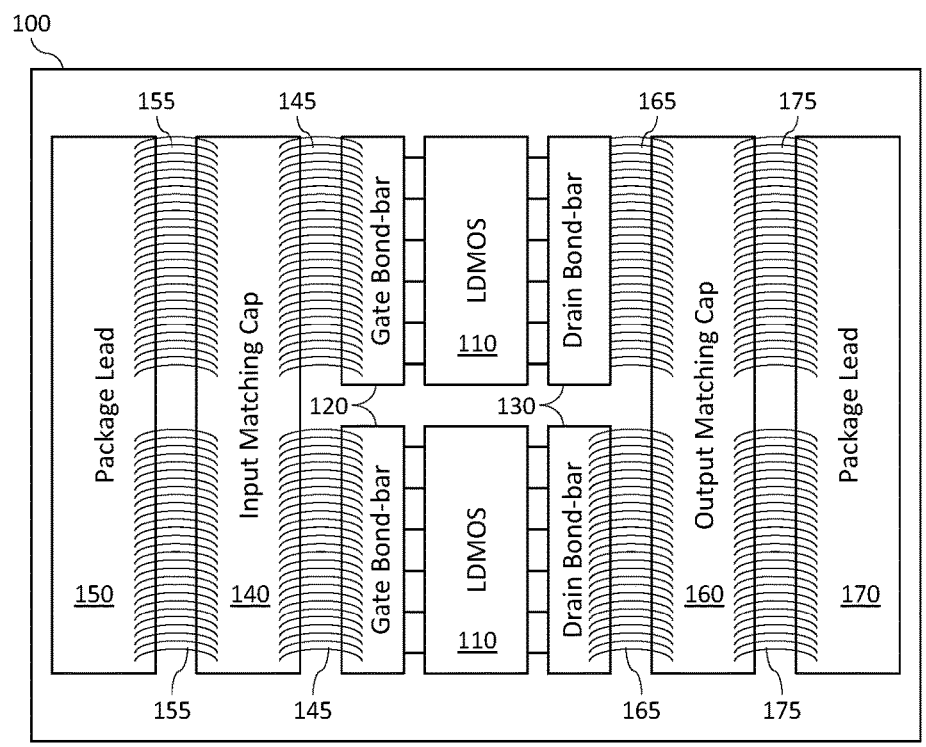
FIG. 1 illustrates a simplified block diagram of a conventional integrated circuit device.

Referring now to FIG. 1, there is illustrated a simplified block diagram of a conventional integrated circuit (IC) device 100 consisting of two active semiconductor power devices 110. In particular, in the illustrated example the IC device 100 consists of two LDMOS transistor devices 110. However, it will be appreciated that in other examples the IC device 100 may consist of other numbers and types of active semiconductor power devices, such as for example, heterojunction bipolar transistor (HBT) devices, pseudomorphic high-electron-mobility transistor (PHEMT) device, Gallium nitride (GaN) devices, bipolar junction transistor (BJT) devices etc.

The LDMOS transistor devices 110 illustrated in FIG. 1 are connected between respective terminal structures consisting of gate bond-bars 120 and drain bond-bars 130. The gate bond-bars 120 are coupled to a first (input) IC package external contact (lead) 150 via bonding wire arrays 145, 155 and an input matching capacitor element 140; the bonding wire arrays 145, 155 and input matching capacitor element 140 providing input matching for the LDMOS transistor devices 110. The drain bond-bars 130 are coupled to a second (output) IC package external contact (lead) 170 via bonding wire arrays 165, 175 and an output matching capacitor element 160; the bonding wire arrays 165, 175 and output matching capacitor element 160 providing output matching for the LDMOS transistor devices 110, which in more specifically providing a lumped element low-pass filter structure having a certain cut-off frequency and characteristic impedance, depending on the parameters of the bond-wire arrays and values of matching capacitances. Such cut-off frequency properties of the low-pass filter structure significantly limits, or even eliminates, the opportunity for the required external higher harmonic control, and also introduces inconsistent device operation if the cut-off frequency is close to certain higher harmonics of the fundamental signal $f_0$. Said characteristic impedance of the structure is typically off the desired range and also strongly depends on frequency, which does not allow building the device with wide instant relative bandwidth of >(10 . . . 20)%. Another problem such state of the art interconnect structures using bond-wires and capacitors is that the metal flange of the package is conducting return RF currents from input lead-ground cross-section to the output lead-ground cross-section plane. Consequently, if the electrical contact of the flange at input or output cross-section plane is not perfect, the device's performance may suffer from mismatch, instability and power capability degradation. To overcome this problem, power RF devices are conventionally soldered to the heat sink, which is an expensive operation.

High frequency (e.g. radio frequency (RF) or microwave frequency) signals within the input and output bonding wire arrays 145, 155 can result in mutual electromagnetic coupling between the bonding wire arrays 145, 155 and within an underlying ground plane due to overlapping of RF return (image) currents taking the same path on the surface of the metal flange (not shown) of the IC device package 100. Such mutual electromagnetic coupling can have a harmful effect on high frequency, e.g. RF, return current distribution flow within the ground plane that can cause RF differential lateral current flow and non-uniform RF voltage distribution along the input and output bond-bars 120, 130, even when a uniformly distributed RF voltage is received at the input terminal (lead) 150 of the device package 100. Another harmful result of such an electromagnetic coupling is poor isolation of two separate active dies allocated within the same IC package next to each other. For example, this occurs when building, for example, a Doherty amplifier based on two RFICs arranged in single, so called "push-pull" packages.

Figure 2:
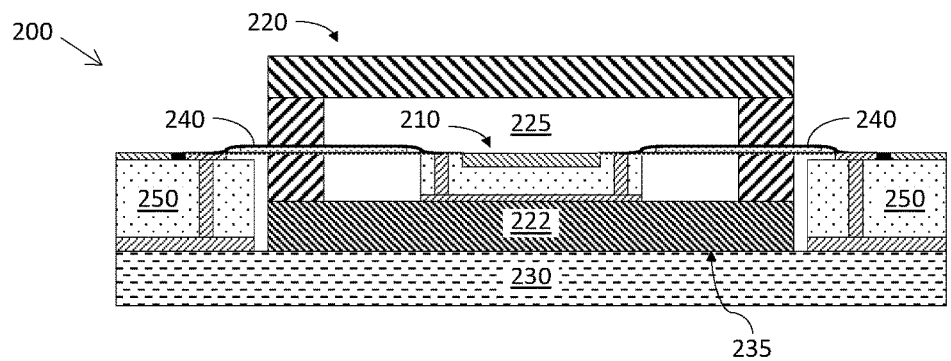
FIG. 2 illustrates a simplified cross-sectional view of an example of an integrated circuit device adapted in accordance with some examples of the present invention.

FIG. 2 illustrates a simplified cross-sectional view of an example of an integrated circuit (IC) device 200 consisting of a semiconductor die 210 located within an IC package 220. The IC package 220 consists of a flange 222 arranged to be mounted on a supporting surface 235. In the illustrated example, the supporting surface 235 is provided by a heat-sink element 230. The semiconductor die 210 is mounted on the flange 222 of the IC package 220. Coupling elements 240 extend through the IC package 220, and provide external coupling of the signal path and the reference/reference plane of, for example, a PCB 250, to the input, output and the 'ground' of the semiconductor die 210, whereby external components are able to be electrically coupled to the semiconductor die 210 located within the IC package 220.

Figure 3:
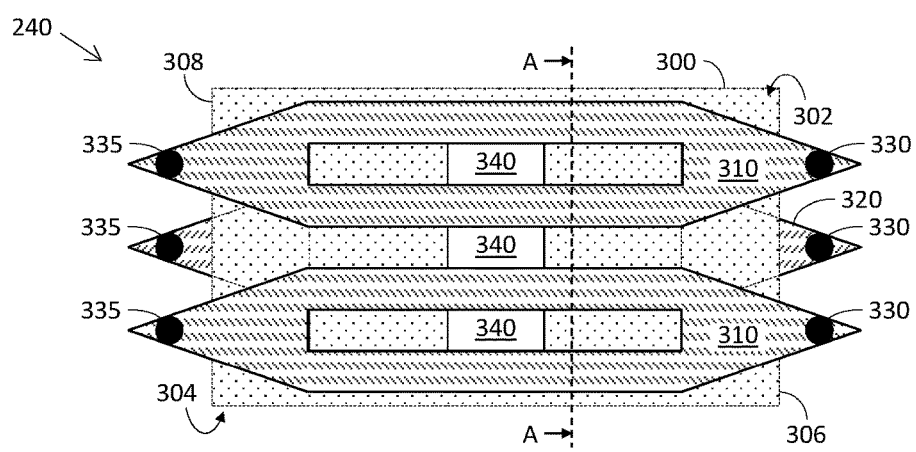
FIG. 3 illustrates a simplified plan view of an example of a coupling.

FIG. 3 illustrates a simplified plan view of an example of one of a coupling elements 240 such as may be implemented in FIG. 2. The coupling element 240 consists of a flexible laminate structure having a flexible, electrically insulating substrate layer 300. One or more conductive layers 310 are bonded to a first (nearside in the illustrated perspective) surface 302 of the substrate layer 300, and one or more further conductive layers 320 are bonded to a second (far side in the illustrated perspective) surface 304 of the substrate layer 300.

The flexible substrate layer 300 may be formed from any suitable material such as, for example, polyimide, liquid crystal polymer, cyclo-olefin polymer, etc. In some examples, additional, protective covering layers (not shown) may be provided on top of the conductive layers 310, 320, such protective layers being formed of polyimide or the like. The conductive layers 310, 320 may also be formed from any suitable conductive material such as, for example, copper. The conductive layers 310, 320 may be bonded to the flexible substrate layer 300 in any suitable manner, for example by way of an epoxy or acrylic adhesive, a coating process, etc.

Referring back to FIG. 2, the coupling element 240 is arranged to be coupled to the semiconductor die 210 such that the conductive layers 310, 320 are electrically coupled to electrical contacts of the semiconductor die 210. In the example illustrated in FIG. 3, each of the conductive layers 310, 320 is arranged to extend beyond a first (internal) edge 306 of the substrate layer 300, and provide a bonding area 330 within a region thereof extending beyond the substrate layer 300 for bonding to a respective bonding pad of the semiconductor die 210. The coupling element 240 is further arranged to extend through the IC package 220 when electrically coupled to the semiconductor die 210, and for the conductive layers 310, 320 to be further electrically coupled to one or more external components, for example a printed circuit board (PCB) 250 as illustrated in FIG. 2, or other external component such as an external matching structure etc. In the example illustrated in FIG. 3, each of the conductive layers 310, 320 is arranged further to extend beyond a second (external) edge 308 of the substrate layer 300, and provide a bonding area 335 within a region thereof extending beyond the substrate layer 300 for bonding to a respective bonding pad of, for example, the PCB 250.

As illustrated in FIG. 3, the use of conductive layers 310, 320 bonded to a substrate layer 300 to create a coupling element 240 consisting of a flexible laminate structure in this manner enables 'broadside' interconnects (formed by the conductive layers 310, 320) to be created that provide the electrical paths between the semiconductor die 210 and external components, which are capable of providing uniformly constant characteristic impedance of suitable value across a very wide frequency band up to 100 GHz. Advantageously, the problem of mutual coupling that arises in the use of arrays of bonding wires (FIG. 1) is significantly reduced, enabling a significantly more uniform input/output signal distribution to be achieved.

Furthermore, the characteristic impedance of each conductive layer 310, 320 can be easily controlled/defined through the shape and dimensions of the conductive layer 310, 320, as well as through the thickness and dielectric constant of the substrate layer 300, whilst being capable of sustaining high current densities.

In some examples, it is proposed that the conductive layer(s) 310 bonded to the first surface 302 of the substrate layer 300 may be arranged to provide a signal path between the semiconductor die 210 and one or more external components, for example via which a signal is driven by an external component. Accordingly, in the case of a radio frequency (RF) application, the conductive layer(s) 310 bonded to the first surface 302 of the substrate layer 300 may be arranged to provide a forward path between the semiconductor die 210 and one or more external components.

Conversely, in some examples it is proposed that the conductive layer(s) 320 bonded to the second surface 304 of the substrate layer 300 may be arranged to provide a reference (e.g. ground) path between the semiconductor die 210 and one or more external components. Accordingly, in the case of a radio frequency (RF) application, the conductive layer(s) 320 bonded to the second surface 304 of the substrate layer 300 may be arranged to provide a return path between the semiconductor die 210 and one or more external components.

Figure 4:
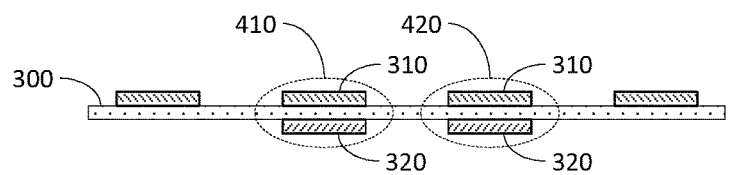
FIG. 4 illustrates a cross-sectional view of the coupling element through the line A:A in FIG. 3.

Thus, in this manner, the signal (e.g. forward) and reference (e.g. ground/return) paths between the semiconductor die 210 and the external component(s) may be provided on opposing surfaces of the substrate layer 300, and in particular the conductive layers may be bonded onto the substrate layer such that the conductive layer(s) 310 bonded to the first surface 302 of the substrate layer 300 providing the signal path(s) at least partially overlap the conductive layer(s) 320 bonded to the second surface 304 of the substrate layer 300 providing the reference path(s). For example, FIG. 4 illustrates a cross-sectional view of the coupling element 240 through the line A:A in FIG. 3. In the illustrated example, the shape and arrangement of the conductive layers 310, 320 forms two overlapping regions 410, 420, whereby signal and reference paths are overlapping.

Advantageously, such an arrangement of the conductive layers 310, 320 enables tight electromagnetic coupling of the forward and return paths in RF applications. Such tight electromagnetic coupling of the forward and return paths results in substantially equal forward and return (or image) RF currents within the opposing conductive layers 310, 320. Accordingly, there will be virtually zero RF current required to flow through the flange 222 of the IC package 220, and thus the harmful effects of the common grounding parasitic inductance Ls introduced by the flange 222 is negligible. Thus, the flange 222 of the IC package 220 does not need to conduct any RF current and also does not affect RF device electrical performance, even if it is not electrically grounded (not connected to the reference plane of, for example, the PCB 150). As a result, a smaller and less expensive flange 222 may be used to provide only heat conductivity and dissipation. In some examples, it is contemplated that the flange 22 need not be made from an electrically conductive material, and can instead be made of a less expensive material, for example a temperature conductive ceramic.

Figure 5:
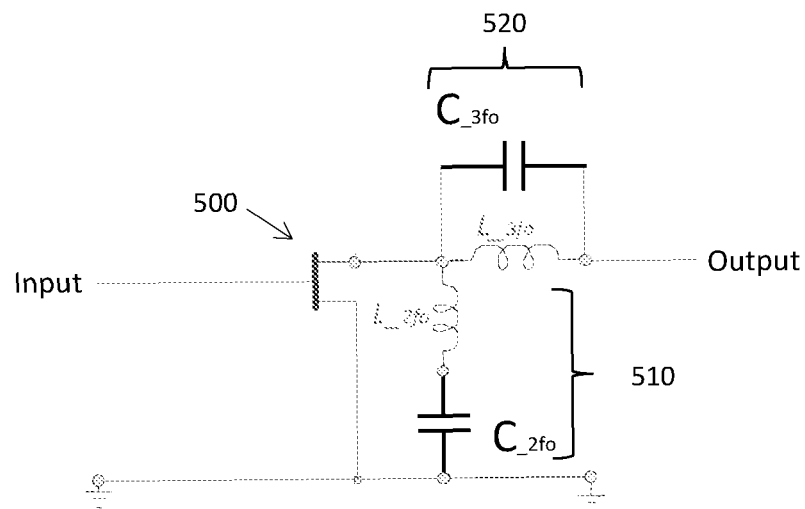
FIG. 5 illustrates a simplified classical F-class amplifier output circuit.
Figure 6:
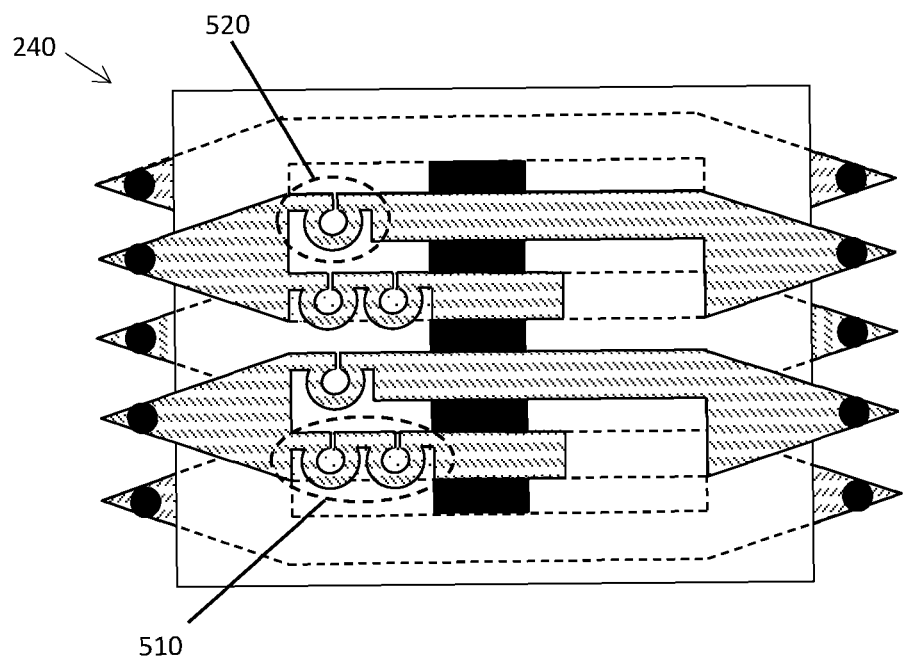
FIG. 6 illustrates a simplified plan view of an example of a coupling element.

Furthermore, as a result of the well-controlled forward and return RF currents of the input and output signal flowing through the conductive layers 310, 320, combining of RF power takes place outside of the IC device 200, which excludes the lateral signal propagation within the IC device structure, thereby enabling the combining of the RF power to be better controlled in very wide frequency bands. Furthermore, the layout of these broadside coupled conductive layers 310, 320 and their RF parameters may be designed in such a way as to provide and integrate passive impedance transformation and power combination networks and/or harmonic terminations for wider bandwidth, higher efficiency and smaller size purposes. For example, FIG. 5 illustrates a simplified classical F-class amplifier output circuit 500, whereby the drain of the amplifier (transistor) device 500 is coupled to ground via a series LC circuit 510, and coupled to the output of the circuit via a parallel LC circuit 520. FIG. 6 illustrates a simplified plan view of an example of a coupling elements 240 whereby the broadside coupled conductive layers 310, 320 have been configured to integrally provide the series and parallel LC circuits 510, 520 illustrated in FIG. 5. Thus, as illustrated in FIG. 6, the conductive layers 310, 320 may be configured to integrally provide required impedance transformation and power combination networks.

The conductive layer(s) 310 bonded to the first surface 302 of the substrate layer 300 may also be arranged to provide one or more power supply paths to the semiconductor die 210.

In RF applications, the semiconductor die 210 has to be coupled to external RF matching structure(s), allocated usually on the PCB 250, and also to a DC power supply (not shown). The DC supply is typically isolated from RF circuits by a low-pass filter network (choke), which plays a role of frequency diplexer, and should provide very low input impedance (<1 Ohm) across the entire frequency band of the fundamental signal (e.g. up to 300 MHz). To provide significantly high impedance to RF signals and minimize losses of RF power and power efficiency, inductances of such a choke and shunt capacitances are relatively high, which creates parasitic parallel resonances at "Cut-Off frequencies of such a low-pass prototype chains, falling within Modern Mobile Communication transmitters modulation signal band. Such parasitic resonances generate non-smooth amplitude and phase characteristics in DC feed lines and output signal distortions or so called "Electrical Memory effects". However, by implementing the DC power supply paths to the semiconductor die 210 via one or more broadside conductive layers, the non-linearity and electrical memory effects generated by conventional bonding wires may be significantly reduced.

Advantageously, the flexible laminated structure herein described for providing a coupling element is suitable for automatic bonding processes, thereby reducing the fabrication and mounting costs for the IC device 200. In some examples, apertures 340 (FIG. 3) may be provided through the laminated structure of the coupling element 240 and through which locating formations (not illustrated) within a ceramic or plastic wall of the IC package 220 may extend to laterally locate the coupling element 240 relative to the IC package 220. In some examples, the internal cavity 225 IC package 220 may be filled with a compound (not illustrated), for example a plastic compound, to further secure and protect the semiconductor die 210 and the coupling element 240 within the IC package 220.

Figure 7:
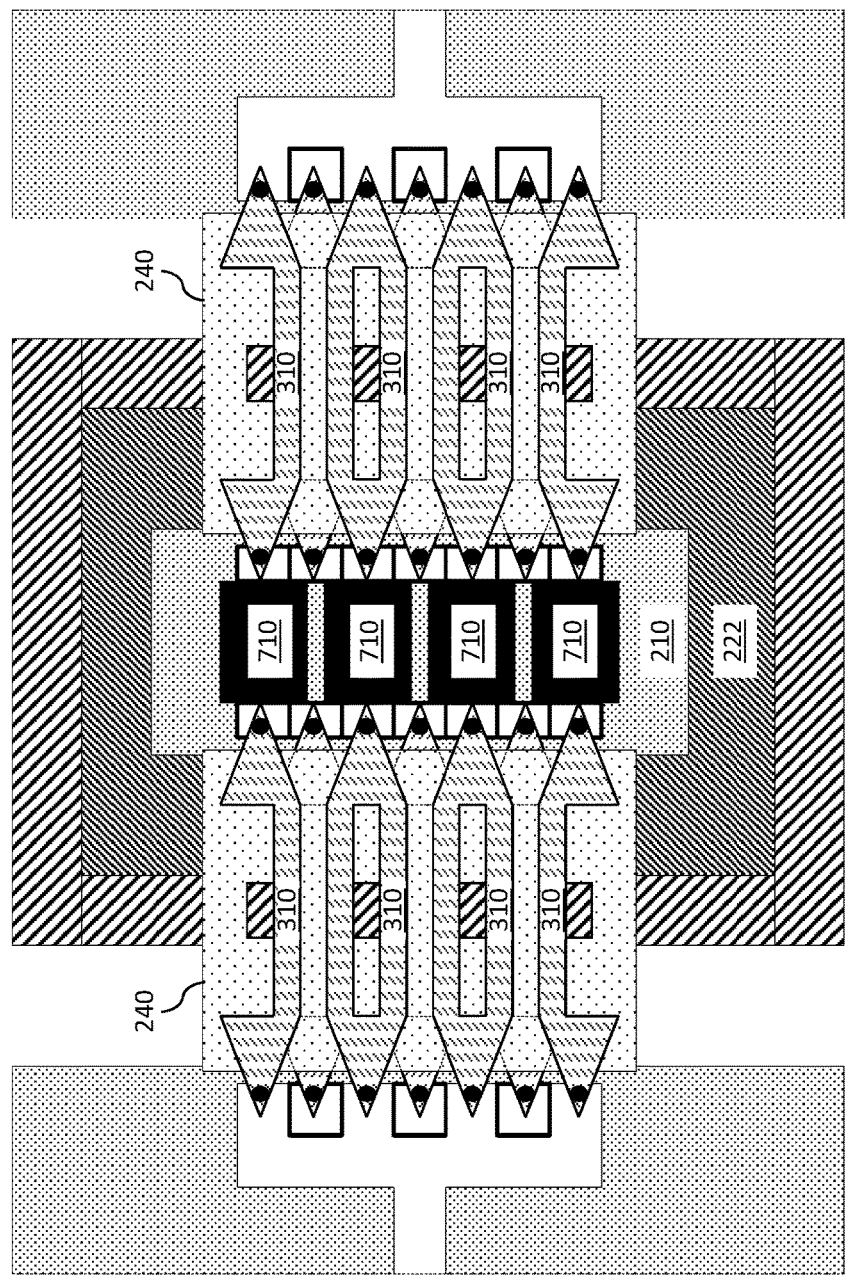
FIG. 7 illustrates a simplified plan view of the integrated circuit device of FIG. 2.

Referring now to FIG. 7, there is illustrated a simplified plan view of the IC device 200 of FIG. 2. The semiconductor die 210 consists of a plurality of (four in the illustrated example) active devices 710 (e.g. LDMOS devices). In the illustrated example, two coupling elements 240 are provided to enable external coupling to the semiconductor die 210; one providing external coupling to inputs of the active devices 710 and one providing external coupling to outputs of the active devices 710. Furthermore, in the illustrated example the input of each active device 710 is electrically coupled to a respective ('private') forward/signal path conductive layer 310 on the first surface 302 (FIG. 3). In this manner, mutual coupling between the inputs of the active devices 710 may be reduced, and the inputs of the active devices 710 may be independently driven. In addition, in the illustrated example, the output of each active device 710 is electrically coupled to a respective ('private') forward/signal path conductive layer 320 on the first surface 304. In this manner, mutual coupling between the outputs of the active devices 710 may be reduced, and the outputs of the active devices 710 may generate extensively independent output signals. Thus, as illustrated in Figure Referring now to FIGS. 8 to 11, there are illustrated a series of simplified build-up figures showing a method of fabricating a coupling element 240 for providing external coupling to a semiconductor die 210 within an IC package 220 (FIGS. 8 and 9), and a part of a method of fabricating an IC device 200 including such coupling elements 240.

Figure 8:
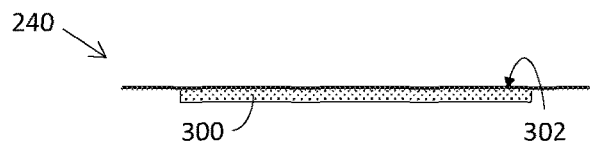
FIGS. 8 and 9 illustrate a series of simplified build-up figures showing a method of fabricating a coupling element for providing external coupling to a semiconductor die within an integrated circuit package.
Figure 9:
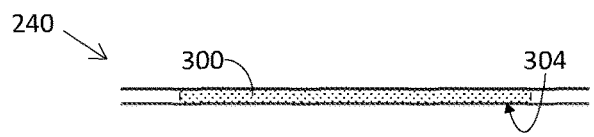

The method of fabricating the coupling element 240 starts at FIG. 8, where one or more conductive layers 310 are bonded to a first surface 302 of a flexible, electrically insulating substrate layer 300. Next, at FIG. 9, one or more further conductive layers 320 are bonded to a second surface 304 of the substrate layer 300. In the illustrated example, the conductive layers 310, 320 are bonded to the substrate layer 300 such that they extend beyond a first edge 306 (FIG. 3) of the substrate layer 300, and provide bonding areas 330 (FIG. 3) for bonding to respective bonding pads of a semiconductor die. Furthermore, in some examples the conductive layers 310, 320 are bonded to the substrate layer 300 such that they extend beyond a second edge 308 (FIG. 3) of the substrate layer 300, and provide bonding areas 335 (FIG. 3) for bonding to respective bonding pads of one or more external components. Furthermore, in some examples the conductive layers 310, 320 are bonded onto the substrate layer 300 such that the conductive layers 310 bonded to the first surface 302 of the substrate layer 300 at least partially overlap with the conductive layers 320 bonded to the second surface 304 of the substrate layer 300.

Figure 10:
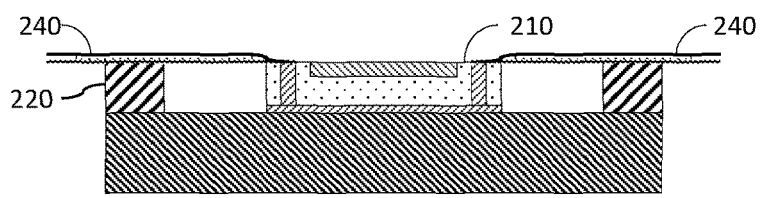
FIGS. 10 and 11 illustrate a series of simplified build-up figures showing a part of a method of fabricating an integrated circuit device.
Figure 11:
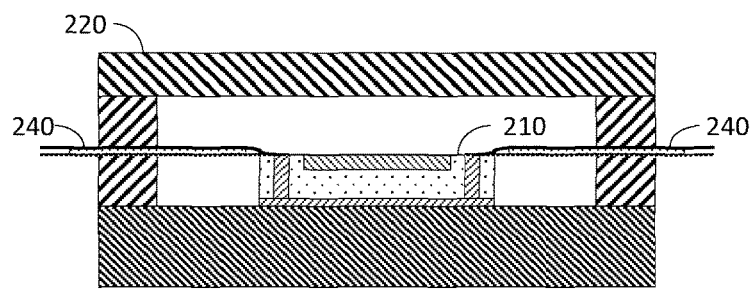

The illustrated part of the method of fabricating the IC device 200 starts at FIG. 10 where coupling elements 240 are coupled to the semiconductor die 210 such that the conductive layers 310, 320 of the coupling elements 240 are electrically coupled to electrical contacts of the semiconductor die 210. Furthermore, the coupling elements 240 are further arranged to extend outside of the IC package 220 such that the conductive layers 310, 320 are able to be further electrically coupled to external components. Next, at FIG. 11, the semiconductor die 210 is enclosed within the IC package 220. Additionally, the IC package 220 may be filled with a compound (not shown) to further secure and protect the semiconductor die 210 and the coupling elements 240 within the IC package 220.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

In particular, it will be appreciated that the invention is not limited to the specific shape and layout of the conductive layers as illustrated in the accompanying drawings, and it will be apparent that the conductive layers may comprise and suitable design and dimensions that provide an appropriate relationship (e.g. electromagnetic coupling in the case of RF applications) between the conductive layers on opposing surfaces of the substrate layer, or any other appropriate coupling characteristics, such as inductance, impedance, etc.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A coupling element for providing external coupling to a semiconductor die within an integrated circuit package; the coupling element comprising a flexible laminate structure comprising:
   a flexible, electrically insulating substrate layer;
   a first conductive layer bonded to a first surface of the substrate layer, the first conductive layer comprising a first bonding area for bonding directly to a first respective bonding pad of the semiconductor die; and
   a second conductive layer bonded to a second surface of the substrate layer, wherein:
   the coupling element is arranged to be coupled to the semiconductor die such that the first and second conductive layers are electrically coupled to electrical contacts of the semiconductor die, the second conductive layer comprising a second bonding area for bonding directly to a second respective bonding pad of the semiconductor die; and
   the coupling element is further arranged to extend through the integrated circuit package when electrically coupled to the semiconductor die, and for the first and second conductive layers to be further electrically coupled to at least one external component.

2. The coupling element of claim 1, wherein the first and second conductive layers are arranged to extend beyond a first edge of the substrate layer.

3. The coupling element of claim 2, wherein the first and second conductive layers are further arranged to extend beyond a second edge of the substrate layer, and provide bonding areas for bonding to respective bonding pads of the at least one external component.

4. The coupling element of claim 1, wherein:
the first conductive layer bonded to the first surface of the substrate layer is arranged to provide a signal path between the semiconductor die and the at least one external component; and
the second conductive layer bonded to the second surface of the substrate layer is arranged to provide a reference path between the semiconductor die and the at least one external component.

5. The coupling element of claim 1, wherein the first and second conductive layers are bonded onto the substrate layer such that they at least partially overlap one another.

6. The coupling element of claim 1 comprising a plurality of conductive layers bonded to the first surface of the substrate layer, and a plurality of conductive layers bonded to the second surface of the substrate layer; wherein the coupling element is arranged to be coupled to the semiconductor die such that each conductive layer is electrically coupled to electrical contacts of the semiconductor die.

7. The coupling element of claim 1, wherein at least one of the first conductive layer and the second conductive layer is configured to integrally provide at least a part of an impedance transformation and power combination network.

8. An integrated circuit device comprising a semiconductor die located within an integrated circuit package and a coupling element for providing external coupling to the semiconductor die; the coupling element comprising a flexible laminate structure comprising:
a flexible, electrically insulating substrate layer;
a first conductive layer bonded to a first surface of the substrate layer, the first conductive layer comprising a first bonding area for bonding directly to a first respective bonding pad of the semiconductor die; and
a second conductive layer bonded to a second surface of the substrate layer, wherein:
the coupling element is arranged to be coupled to the semiconductor die such that the first and second conductive layers are electrically coupled to electrical contacts of the semiconductor die, the second conductive layer comprising a second bonding area for bonding directly to a second respective bonding pad of the semiconductor die; and
the coupling element is further arranged to extend through the integrated circuit package when electrically coupled to the semiconductor die, and for the first and second conductive layers to be further electrically coupled to at least one external component.

9. The integrated circuit device of claim 8, wherein the first and second conductive layers are arranged to extend beyond a first edge of the substrate layer.

10. The integrated circuit device of claim 9, wherein the first and second conductive layers are further arranged to extend beyond a second edge of the substrate layer, and provide bonding areas for bonding to respective bonding pads of the at least one external component.

11. The integrated circuit device of claim 8, wherein:
the first conductive layer bonded to the first surface of the substrate layer is arranged to provide a signal path between the semiconductor die and the at least one external component; and
the second conductive layer bonded to the second surface of the substrate layer is arranged to provide a reference path between the semiconductor die and the at least one external component.

12. The integrated circuit device of claim 8, wherein the first and second conductive layers are bonded onto the substrate layer such that they at least partially overlap one another.

13. The integrated circuit device of claim 8, wherein the coupling element comprises a plurality of conductive layers bonded to the first surface of the substrate layer, and a plurality of conductive layers bonded to the second surface of the substrate layer; wherein the coupling element is arranged to be coupled to the semiconductor die such that each conductive layer is electrically coupled to electrical contacts of the semiconductor die.

14. The integrated circuit device of claim 13, wherein the semiconductor die comprises a plurality of active devices, and at least one conductive layer bonded to the first surface of the substrate layer is electrically coupled respectively to each active element of the semiconductor die.

15. The integrated circuit device of claim 8, wherein at least one of the first conductive layer and the second conductive layer is configured to integrally provide at least a part of an impedance transformation and power combination network.

16. A method of fabricating a coupling element for providing external coupling to a semiconductor die within an integrated circuit package; the method comprising:
bonding a first conductive layer to a first surface of a flexible, electrically insulating substrate layer, the first conductive layer comprising a first bonding area for bonding directly to a first respective bonding pad of the semiconductor die; and
bonding a second conductive layer to a second surface of the substrate layer,
wherein:
the coupling element is arranged to be coupled to the semiconductor die such that the first and second conductive layers are electrically coupled to electrical contacts of the semiconductor die, the second conductive layer comprising a second bonding area for bonding directly to a second respective bonding pad of the semiconductor die; and
the coupling element is further arranged to extend through the integrated circuit package when electrically coupled to the semiconductor die, and for the first and second conductive layers to be further electrically coupled to at least one external component.

17. The method of claim 16, wherein the first and second conductive layers are bonded to the substrate layer such that they extend beyond a first edge of the substrate layer.

18. The method of claim 17, wherein the first and second conductive layers are bonded to the substrate layer such that they extend beyond a second edge of the substrate layer, and provide bonding areas for bonding to respective bonding pads of the at least one external component.

19. The method of claim 16, wherein the first and second conductive layers are bonded onto the substrate layer such that they at least partially overlap one another.

20. The method of claim 16 comprising:
bonding a plurality of conductive layers to the first surface of the substrate layer; and
bonding a plurality of conductive layers to the second surface of the substrate layer;
wherein the coupling element is arranged to be coupled to the semiconductor die such that each conductive layer is electrically coupled to electrical contacts of the semiconductor die.

* * * * *